(12) United States Patent
Yu et al.

(10) Patent No.: US 12,557,541 B2
(45) Date of Patent: Feb. 17, 2026

(54) DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventors: Yang Yu, Beijing (CN); Fangxu Cao, Beijing (CN); Wenqiang Li, Beijing (CN); Pinfan Wang, Beijing (CN); Bo Wang, Beijing (CN); Jingquan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 733 days.

(21) Appl. No.: 17/915,365

(22) PCT Filed: Sep. 1, 2021

(86) PCT No.: PCT/CN2021/116049
§ 371 (c)(1),
(2) Date: Sep. 28, 2022

(87) PCT Pub. No.: WO2022/083306
PCT Pub. Date: Apr. 28, 2022

(65) Prior Publication Data
US 2023/0157101 A1    May 18, 2023

(30) Foreign Application Priority Data
Oct. 22, 2020   (CN) .......................... 202011140933.2

(51) Int. Cl.
*H10K 77/10* (2023.01)
*H10K 59/12* (2023.01)
(Continued)

(52) U.S. Cl.
CPC ....... *H10K 77/111* (2023.02); *H10K 59/1201* (2023.02); *H10K 59/131* (2023.02);
(Continued)

(58) Field of Classification Search
CPC .................................................... H10K 77/111
See application file for complete search history.

(56) References Cited

U.S. PATENT DOCUMENTS

| 2019/0288234 A1 | 9/2019 | Kim et al. |
| 2020/0027940 A1* | 1/2020 | Wang .................... H10K 50/84 |
| 2021/0359069 A1 | 11/2021 | Wang et al. |

FOREIGN PATENT DOCUMENTS

| CN | 110233161 A | 9/2019 |
| CN | 111653595 A | 9/2020 |

(Continued)

*Primary Examiner* — Douglas M Menz
(74) *Attorney, Agent, or Firm* — XSENSUS LLP

(57) ABSTRACT

A display substrate has a display area and a non-display area adjacent to the display area. The display substrate comprises: a flexible substrate including at least one stretchable region, the stretchable regions extending from the display area to the non-display area, and being provided with a plurality of holes arranged in an array therein, and at least one signal line disposed on a first side of the flexible substrate and located in the non-display area, and an orthographic projection of the signal line on the flexible substrate is at least partially non-overlapping with each hole of the plurality of holes.

17 Claims, 8 Drawing Sheets

(51) Int. Cl.
*H10K 59/131* (2023.01)
*H10K 59/80* (2023.01)
*H10K 50/844* (2023.01)

(52) U.S. Cl.
CPC ..... *H10K 59/80521* (2023.02); *H10K 50/844* (2023.02); *H10K 59/873* (2023.02)

(56) References Cited

FOREIGN PATENT DOCUMENTS

| | | |
|---|---|---|
| CN | 111799392 A | 10/2020 |
| CN | 112271196 A | 1/2021 |
| CN | 113410414 A | 9/2021 |

\* cited by examiner

DISPLAY SUBSTRATE AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN2021/116049, filed on Sep. 1, 2021, which claims priority to Chinese Patent Application No. 202011140933.2, filed on Oct. 22, 2020, which are incorporated herein by reference in their entirety.

TECHNICAL FIELD

The present disclosure relates to the field of display technologies, and in particular, to a display substrate and a manufacturing method therefor, and a display apparatus.

BACKGROUND

Display apparatuses, such as active-matrix organic light-emitting diode (AMOLED) display apparatuses, have advantages of being able to individually control each sub-pixel to perform display, high contrast ratio, bright colors and the like. However, a bezel area of the existing AMOLED display apparatus does not have stretchability, which makes it difficult to be applied to a curved display product.

SUMMARY

In an aspect, a display substrate is provided. The display substrate has a display area and a non-display area adjacent to the display area. The display substrate includes a flexible substrate and at least one signal line. The flexible substrate includes at least one stretchable region, and the stretchable region extends from the display area to the non-display area, and is provided with a plurality of holes arranged in an array therein. The at least one signal line is disposed on a first side of the flexible substrate and located in the non-display area, and an orthographic projection of a signal line on the flexible substrate is at least partially non-overlapping with each hole of the plurality of holes.

In some embodiments, the orthographic projection of the signal line on the flexible substrate is non-overlapping with each hole of the plurality of holes exactly.

In some embodiments, the signal line has at least one first avoidance opening, and an orthogonal projection of a border of the first avoidance opening on the flexible substrate is disposed around a hole. The display substrate further includes at least one isolation column disposed on the first side of the flexible substrate. An orthographic projection of a border of an isolation column on the flexible substrate is disposed around the hole, and the isolation column covers at least a sidewall of the first avoidance opening exposing the hole.

In some embodiments, the isolation column further covers a portion, proximate to the first avoidance opening, of a surface of the signal line away from the flexible substrate.

In some embodiments, the signal line includes a first metal layer and a second metal layer that are sequentially away from the flexible substrate. The isolation column includes a first organic insulating layer and a second organic insulating layer that are sequentially away from the flexible substrate. The first organic insulating layer covers a side of the first metal layer proximate to the hole and a portion of a surface of the first metal layer away from the flexible substrate; the second metal layer is in electrical contact with the first metal layer, and the second metal layer covers a side of the first organic insulating layer away from the hole and a portion of a surface of the first organic insulating layer away from the flexible substrate; the second organic insulating layer covers a side of the second metal layer proximate to the hole and a portion of a surface of the second metal layer away from the flexible substrate.

In some embodiments, the isolation column further includes a first inorganic insulating layer and a second inorganic insulating layer. A portion of the first inorganic insulating layer is located between the first organic insulating layer and the flexible substrate, another portion of the first inorganic insulating layer is located between the first metal layer and the second metal layer, and yet another portion of the first inorganic insulating layer is located between the first metal layer and the first organic insulating layer; the second inorganic insulating layer covers at least a portion of a surface of the second organic insulating layer away from the flexible substrate, a side of the second organic insulating layer proximate to the hole and a side of the first organic insulating layer proximate to the hole. The second inorganic insulating layer is in contact with to the first inorganic insulating layer.

In some embodiments, the display substrate further includes a light-emitting functional layer and a cathode layer that are sequentially disposed on the first side of the flexible substrate. The cathode layer extends from the display area to the non-display area, and a border of the cathode layer is located in the non-display area. The light-emitting functional layer extends from the display area to the non-display area, and an orthographic projection of the light-emitting functional layer on the flexible substrate is located within an orthographic projection of the cathode layer on the flexible substrate. An isolation column covered by the cathode layer is provided with a partition groove therein, the partition groove is disposed around the hole, and the partition groove is configured to partition the cathode layer or partition both the cathode layer and the light-emitting functional layer.

In some embodiments, the isolation column includes a second organic insulating layer and a second inorganic insulating layer, the second organic insulating layer and the second inorganic insulating layer are arranged in a stack, and the partition groove passes through the second inorganic insulating layer and at least a portion of the second organic insulating layer.

In some embodiments, a section obtained by sectioning the partition groove with a plane parallel to both of a radial direction of the hole and a thickness direction of the display substrate is substantially in a shape of an inverted "T".

In some embodiments, the signal line is a voltage signal line, and the voltage signal line is disposed around the display area. The display substrate further includes a cathode lapping layer located in the non-display area. The cathode lapping layer includes a first portion and a second portion connected to each other, the first portion is electrically connected to a surface of the cathode layer proximate to the flexible substrate, and the second portion is connected to a surface of the voltage signal line away from the flexible substrate. The cathode lapping layer has at least one second avoidance opening, and an orthogonal projection of a border of a second avoidance opening on the flexible substrate is disposed around the hole.

In some embodiments, at least a portion of the isolation column covers a sidewall of the second avoidance opening; alternatively, at least a portion of the isolation column covers the sidewall of the second avoidance opening and a portion, proximate to the second avoidance opening, of a surface of the cathode lapping layer away from the flexible substrate.

In some embodiments, the display substrate further includes a first blocking dam, a second blocking dam, and an encapsulation layer. The first blocking dam is disposed on the first side of the flexible substrate, and the first blocking dam is located in the non-display area and disposed around the display area. The first blocking dam covers at least a side of the voltage signal line away from the display area and a side of the cathode lapping layer away from the display area; the first blocking dam has at least one third avoidance opening, and an orthogonal projection of a border of a third avoidance opening on the flexible substrate is disposed around the hole. The second blocking dam is disposed on the first side of the flexible substrate, and the second blocking dam is located in the non-display area and disposed around the display area. The second blocking dam is located on a surface of the second portion of the cathode lapping layer away from the flexible substrate; the second blocking dam has at least one fourth avoidance opening, and an orthogonal projection of a border of a fourth avoidance opening on the flexible substrate is disposed around the hole. The encapsulation layer is disposed on the first side of the flexible substrate, and the encapsulation layer covers the cathode layer, the first blocking dam and the second blocking dam; the encapsulation layer has at least one fifth avoidance opening, and an orthogonal projection of a border of a fifth avoidance opening on the flexible substrate is disposed around the hole.

In some embodiments, the display substrate further includes a buffer layer. The buffer layer is located on a surface of the first side of the flexible substrate, the buffer layer extends from the display area to the non-display area, and a border of the buffer layer is located on a side of the first blocking dam away from the display area. A portion of the buffer layer extending to the side of the first blocking dam away from the display area is provided with at least one groove therein, and the at least one groove is disposed around the first blocking dam.

In some embodiments, the display substrate further includes a third blocking dam covering the at least one groove in the buffer layer.

In some embodiments, the plurality of holes arranged in the array include first holes each extending in a first direction, and second holes each extending in a second direction intersecting the first direction. The first holes and the second holes are alternately arranged in both of the first direction and the second direction.

In another aspect, a display apparatus is provided. The display apparatus includes the display substrate as described in any one of the above embodiments.

In yet another aspect, a manufacturing method for a display substrate is provided. The display substrate has a display area and a non-display area adjacent to the display area. The manufacturing method includes: forming a plurality of holes arranged in an array in a stretchable region of a flexible substrate, the stretchable region extending from the display area to the non-display area; and forming at least one signal line on a first side of the flexible substrate, the signal line being located in the non-display area, and an orthographic projection of the signal line on the flexible substrate is at least partially non-overlapping with each hole of the plurality of holes.

In some embodiments, the signal line has at least one first avoidance opening, and an orthogonal projection of a border of a first avoidance opening on the flexible substrate is disposed around the hole. The manufacturing method further includes: forming at least one isolation column on the first side of the flexible substrate. An orthographic projection of a border of an isolation column on the flexible substrate is disposed around the hole, and the isolation column covers at least a sidewall of the first avoidance opening exposing the hole.

In some embodiments, the at least one isolation column includes isolation columns, and each isolation column includes a second organic insulating layer and a second inorganic insulating layer that are sequentially away from the flexible substrate. The manufacturing method further includes: etching the second inorganic insulating layer and at least a portion of the second organic insulating layer by an etching process to form a partition groove on a surface, away from the flexible substrate, of each of at least part of the isolation columns. The partition groove is disposed around the hole.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
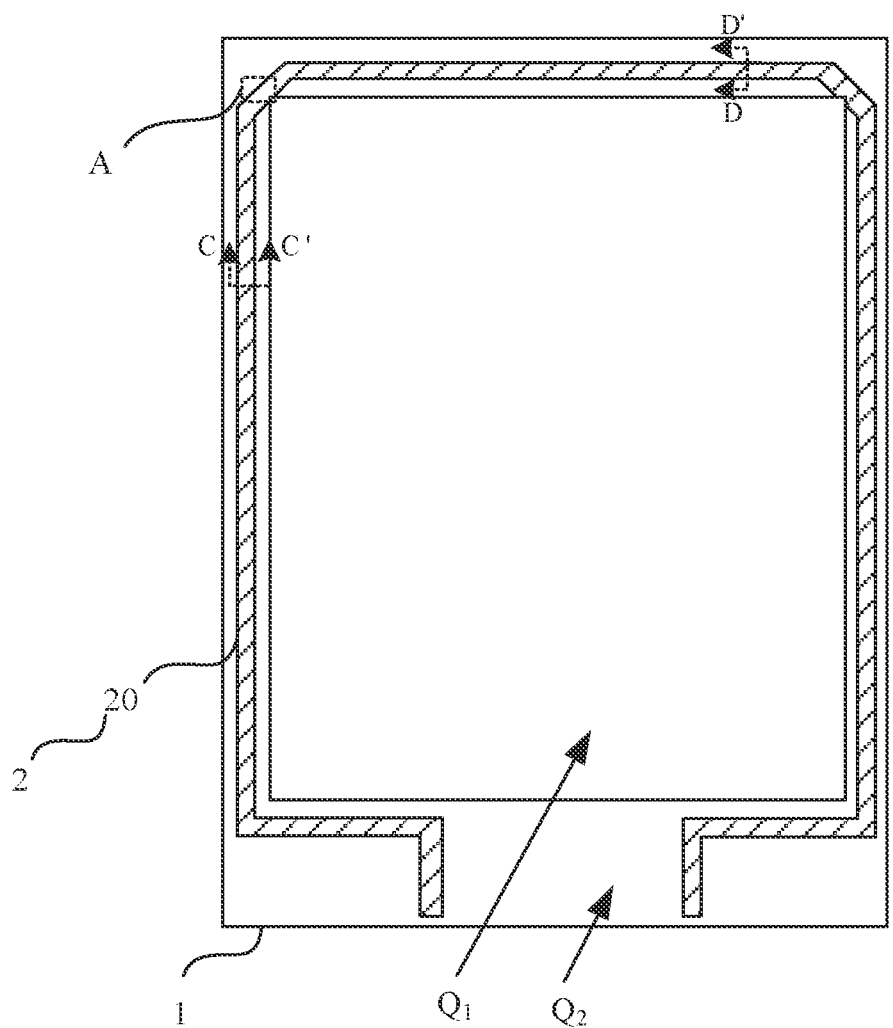
FIG. 1 is a diagram showing a structure of a display substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified. The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

Additionally, the phrase "based on" as used herein is meant to be open and inclusive, since a process, step, a calculation or other action that is "based on" one or more of the stated conditions or values may, in practice, be based on additional conditions or values beyond those stated.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Referring to FIG. 1, some embodiments of the present disclosure provide a display substrate 100. The display substrate 100 has a display area $Q_1$ and a non-display area $Q_2$ adjacent to the display area $Q_1$. The non-display area $Q_2$ may be located only on one or more sides of the display area $Q_1$; alternatively, the non-display area $Q_2$ may be disposed in a circle around the display area $Q_1$ according to the example as shown in FIG. 1.

As shown in FIGS. 3A to 6, the display substrate 100 includes a flexible substrate 1 and at least one signal line 2 (e.g., a voltage signal line 20 or a clock signal line) disposed on a first side of the flexible substrate 1.

Figure 2:
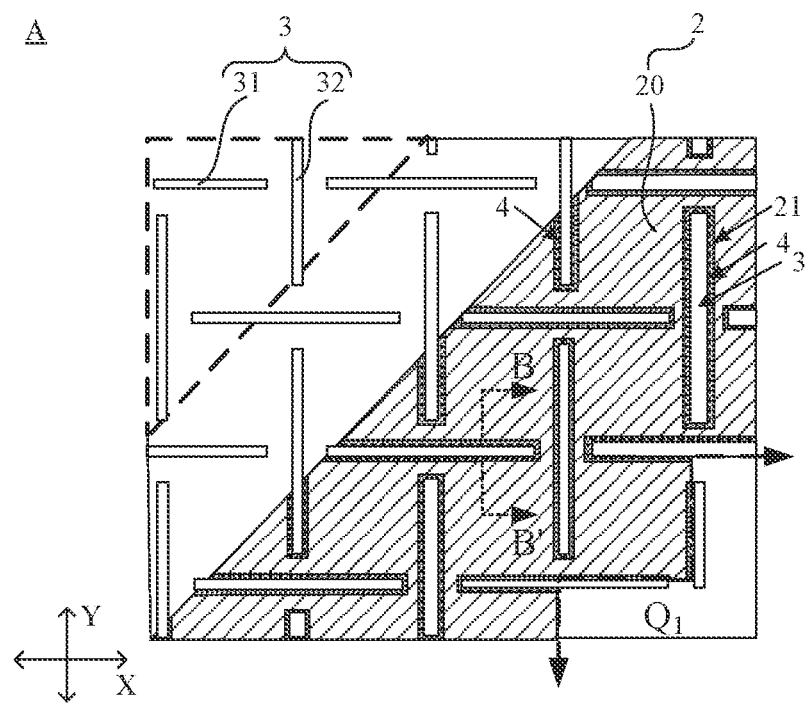
FIG. 2 is a diagram showing a partial structure of the display substrate in FIG. 1 in a stretchable region A.

As shown in FIGS. 1 and 2, the flexible substrate 1 include at least one stretchable region A, the stretchable region A extends from the display area $Q_1$ to the non-display area $Q_2$, and the flexible substrate 1 is provided with a plurality of holes 3 arranged in an array in the stretchable region A. For example, the stretchable region A may be any one of four corners in the example as shown in FIG. 1. For another example, all of the flexible substrate 1 is the stretchable region A. That is, the stretchable region A covers all of the display area $Q_1$ and all of the non-display area $Q_2$. In this way, the flexible substrate 1 may have basically the same stretchability in the display area $Q_1$ and the non-display area $Q_2$.

In a process of manufacturing the display substrate 100, holes 3 may be directly manufactured in a display substrate mother board, and then cutting is performed thereon to obtain the single display substrate 100. On this basis, referring to FIG. 2, the corner of the display substrate 100 (i.e., a position in the triangular dotted box in FIG. 2) may be cut to form a rounded corner, which facilitates application thereof in a display apparatus having a rounded corner. For example, as shown in FIG. 2, the corner to be cut is provided with holes 3 therein.

Specific arrangement manners of "the plurality of holes 3 arranged in the array" may vary. For example, as shown in FIG. 2, the plurality of holes 3 arranged in the array may include first holes 31 each extending in a first direction X and second holes 32 each extending in a second direction Y intersecting the first direction X. The first holes 31 and the second holes 32 are alternately arranged in both of the first direction X and the second direction Y. With this arrangement, it is conducive to making the flexible substrate 1 have good stretchability.

The second direction Y intersects the first direction X, which includes but is not limited to the manner that the second direction Y and the first direction X are perpendicular to each other as shown in FIG. 2. That is, an angle between the second direction Y and the first direction X is not limited to a right angle; alternatively, the angle may be an acute angle.

Figure 3A:
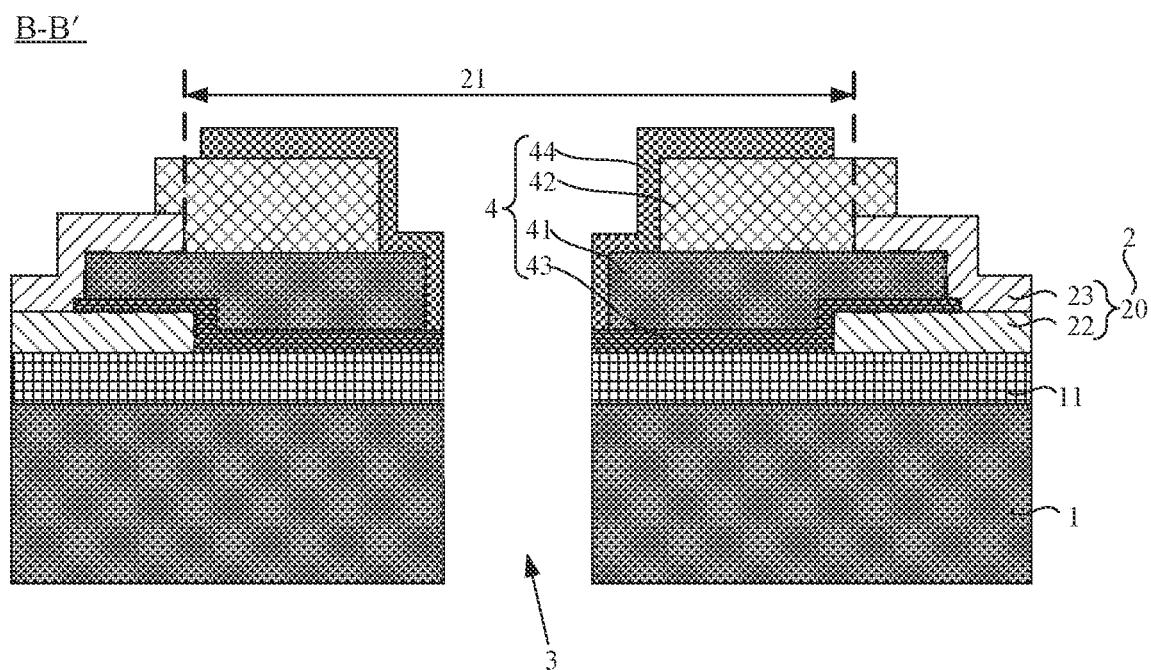
FIG. 3A is a diagram showing a sectional structure in the stretchable region A in FIG. 2 taken along the line B-B'.
Figure 3B:
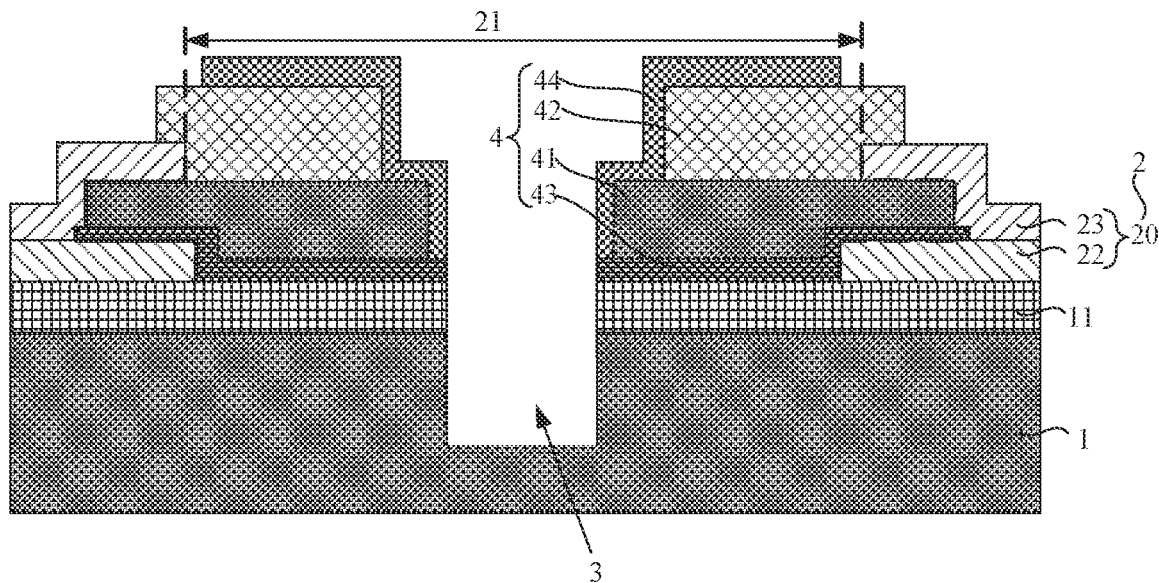
FIG. 3B is a diagram showing another sectional structure in the stretchable region A in FIG. 2 taken along the line B-B'.

In some examples, as shown in FIG. 3A, the hole 3 is a via hole penetrating the flexible substrate 1. In some other examples, as shown in FIG. 3B, the hole 3 is a blind hole. It will be understood that in a case where the hole 3 is the blind hole, the hole 3 only has an opening on the first side of the flexible substrate 1. Moreover, the embodiments of the present disclosure do not limit a depth of the blind hole. That is, the depth of the blind hole may be determined according to the stretchability needed to be realized. For example, the greater the depth of the blind hole, the larger the stretchable range; and conversely, the less the depth of the blind hole, the smaller the stretchable range.

With continued reference to FIGS. 1 and 2, the signal line 2 is located in the non-display area $Q_2$, and an orthographic projection of the signal line 2 on the flexible substrate 1 is at least partially non-overlapping with each hole 3 (e.g., the first hole 31 or the second hole 32) of the plurality of holes 3. For example, when the signal line 2 is provided, with reference to the example as shown in FIG. 2, openings may be provided in the signal line 2 to achieve exposing the plurality of holes 3.

"Being at least partially non-overlapping with each hole 3" may refer to that the orthographic projection of the signal line 2 on the flexible substrate 1 is partially non-overlapping with each hole 3, or may refer to that the orthographic projection of the signal line 2 on the flexible substrate 1 is non-overlapping with each hole 3 exactly.

It is worth pointing out that in the display substrate 100, the stretchable region A of the flexible substrate 1 extends from the display area $Q_1$ to the non-display area $Q_2$, and the plurality of holes 3 arranged in the array are disposed in the stretchable region A of the flexible substrate 1. Therefore, the flexible substrate 1 may be stretched in at least a portion of the display area $Q_1$ and at least a portion of the non-display area $Q_2$. With this design, in a case where the display substrate 100 is applied to a display apparatus, it is easy to achieve an effect of curved display of the display apparatus by stretching the display substrate 100.

Moreover, the orthographic projection of the signal line 2 located in the non-display area $Q_2$ on the flexible substrate 1 is at least partially non-overlapping with each hole 3, so that the arrangement of the signal line 2 does not easily affect the arrangement positions of the holes 3 in the non-display area $Q_2$. As a result, the stretchable region A of the flexible substrate 1 may have basically the same stretchability in the display area $Q_1$ and the non-display area $Q_2$.

In some embodiments, as shown in FIG. 2, the signal line 2 has at least one first avoidance opening 21, and an orthogonal projection of a border of a first avoidance opening 21 on the flexible substrate 1 is disposed around a hole 3. For example, in the example as shown in FIG. 2, the orthogonal projection of the border of the first avoidance opening 21 on the flexible substrate 1 may be disposed around the hole 3 in a circle, or may be disposed around the hole 3 in a half circle or a one-third circle.

It will be noted that, FIG. 2 only shows an example in which the orthogonal projection of the border of the first avoidance opening 21 on the flexible substrate 1 is disposed around a single hole 3. In other examples, the orthogonal projection of the border of the first avoidance opening 21 on the flexible substrate 1 may be disposed around two or more holes 3, which is not limited in the embodiments of the present disclosure.

A sidewall of the first avoidance opening 21 may be in a shape of a closed annulus as shown in FIG. 2; alternatively, the sidewall of the first avoidance opening 21 may be in a shape of a partial annulus with an opening as shown in FIG. 2.

On this basis, referring to FIGS. 2, 3A and 3B, the display substrate 100 further includes at least one isolation column 4 disposed on the first side of the flexible substrate 1. An orthographic projection of a border of an isolation column 4 on the flexible substrate 1 is disposed around the hole 3 (for example, the orthographic projection of the border of the isolation column 4 on the flexible substrate 1 may be disposed around the hole 3 in a circle; alternatively, the orthographic projection of the border of the isolation column 4 on the flexible substrate 1 may be disposed around the hole 3 in a half circle or a one-third circle), and the isolation column 4 covers at least the sidewall of the first avoidance opening 21 exposing the hole 3.

In this way, the isolation column 4 may be used to protect a sidewall (i.e., the sidewall of the first avoidance opening 21) of the signal line 2 proximate to the hole 3. For example, a material of the signal line 2 may generally include metal such as aluminum (Al). The isolation column 4 may prevent moisture from permeating from the hole 3 to the signal line 2, thereby preventing problems such as corrosion of Al from occurring in the signal line 2; furthermore, during the subsequent etching process, it is possible to prevent a replacement reaction from undergoing between the Al in the signal line 2 and silver (Ag) ions in an etching solution. Therefore, the isolation column 4 may protect the signal line 2 effectively.

On this basis, for example, referring to FIGS. 3A and 3B, the isolation column 4 further covers a portion, proximate to the first avoidance opening 21, of a surface of the signal line 2 away from the flexible substrate 1. In this way, the isolation column 4 may be used to better protect the signal line 2.

In some embodiments, as shown in FIGS. 3A and 3B, the signal line 2 includes a first metal layer 22 and a second metal layer 23 that are sequentially away from the flexible substrate 1. In this way, it is conducive to reducing a resistance of the signal line 2 to improve a signal transmission efficiency.

On this basis, for example, as shown in FIGS. 3A and 3B, the isolation column 4 includes a first organic insulating layer 41 and a second organic insulating layer 42 that are sequentially away from the flexible substrate 1.

The first organic insulating layer 41 covers a side of the first metal layer 22 proximate to the hole 3 and a portion of a surface of the first metal layer 22 away from the flexible substrate 1.

The second metal layer 23 is in electrical contact with the first metal layer 22, and the second metal layer 23 covers a side of the first organic insulating layer 41 away from the hole 3 and a portion of a surface of the first organic insulating layer 41 away from the flexible substrate 1.

The second organic insulating layer 42 covers a side of the second metal layer 23 proximate to the hole 3 and a portion of a surface of the second metal layer 23 away from the flexible substrate 1.

With this design, the first organic insulating layer 41 and the second organic insulating layer 42 may be used to effectively protect the first metal layer 22 and the second metal layer 23 of the signal line 2.

On this basis, for example, as shown in FIGS. 3A and 3B, the isolation column 4 further includes a first inorganic insulating layer 43 and a second inorganic insulating layer 44.

A portion of the first inorganic insulating layer 43 is located between the first organic insulating layer 41 and the flexible substrate 1, another portion of the first inorganic insulating layer 43 is located between the first metal layer 22 and the second metal layer 23, and yet another portion of the first inorganic insulating layer 43 is located between the first metal layer 22 and the first organic insulating layer 41.

The second inorganic insulating layer 44 covers at least a portion of a surface of the second organic insulating layer 42 away from the flexible substrate 1, a side of the second organic insulating layer 42 proximate to the hole 3 and a side of the first organic insulating layer 41 proximate to the hole 3. The second inorganic insulating layer 44 is in contact with to the first inorganic insulating layer 43.

In this way, the isolation column 4 has better barrier capability, so that the isolation column 4 may be used to protect the signal line 2 more effectively.

Figure 3C:
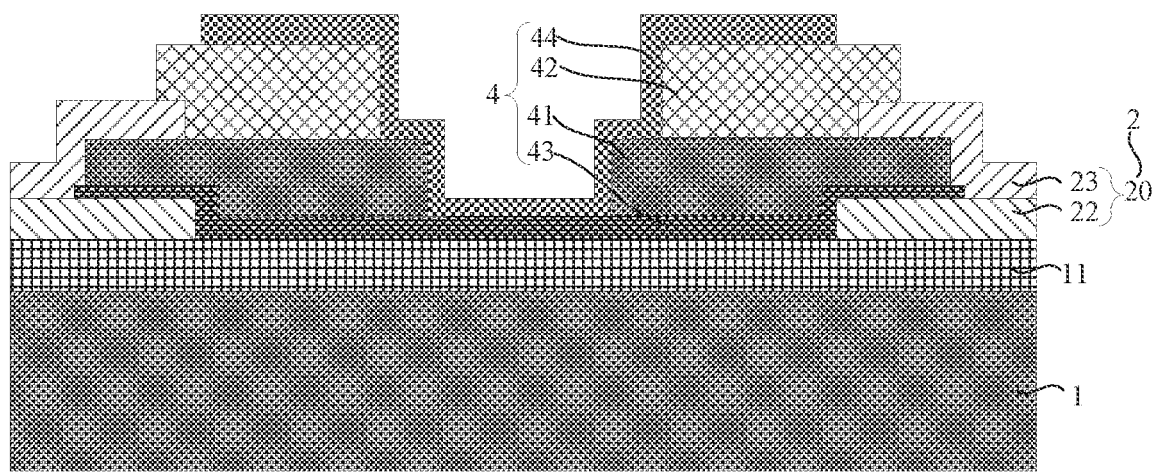
FIG. 3C is a diagram showing a sectional structure of a display substrate to be processed to form holes therein, in accordance with some embodiments.

In the process of manufacturing the display substrate 100, for example, after the structure shown in FIG. 3C is formed (that is, after the second inorganic insulating layer 44 is manufactured), the hole 3 (e.g., the via hole shown in FIG. 3A or the blind hole shown in FIG. 3B) may be formed by an etching process.

Figure 4A:
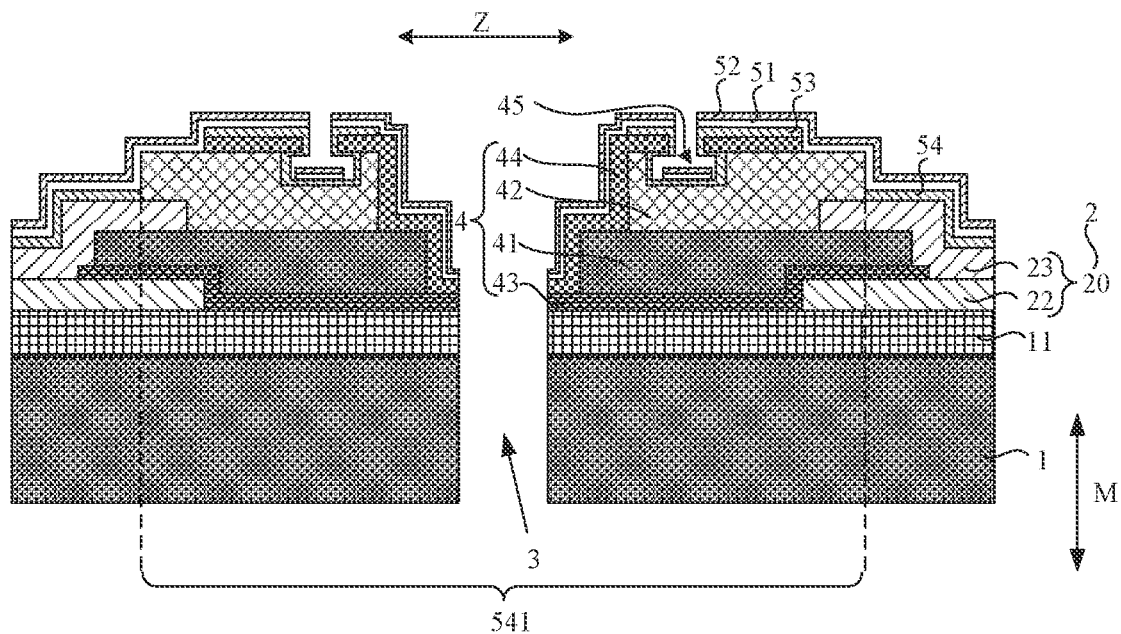
FIG. 4A is a diagram showing a sectional structure of a display substrate in which a cathode layer and a light-emitting functional layer are both partitioned, in accordance with some embodiments.

In some embodiments of the present disclosure, as shown in FIG. 4A, the display substrate 100 further includes a light-emitting functional layer 51 (e.g., an electron transporting layer, an electron injection layer, an organic light-emitting layer, a hole injection layer and a hole transporting layer) and a cathode layer 52 that are sequentially disposed on the first side of the flexible substrate 1. The cathode layer 52 extends from the display area to the non-display area, and a border of the cathode layer 52 is located in the non-display area. The light-emitting functional layer 51 extends from the display area to the non-display area, and an orthographic projection of the light-emitting functional layer 51 on the flexible substrate 1 is located within an orthographic projection of the cathode layer 52 on the flexible substrate 1.

Figure 4B:
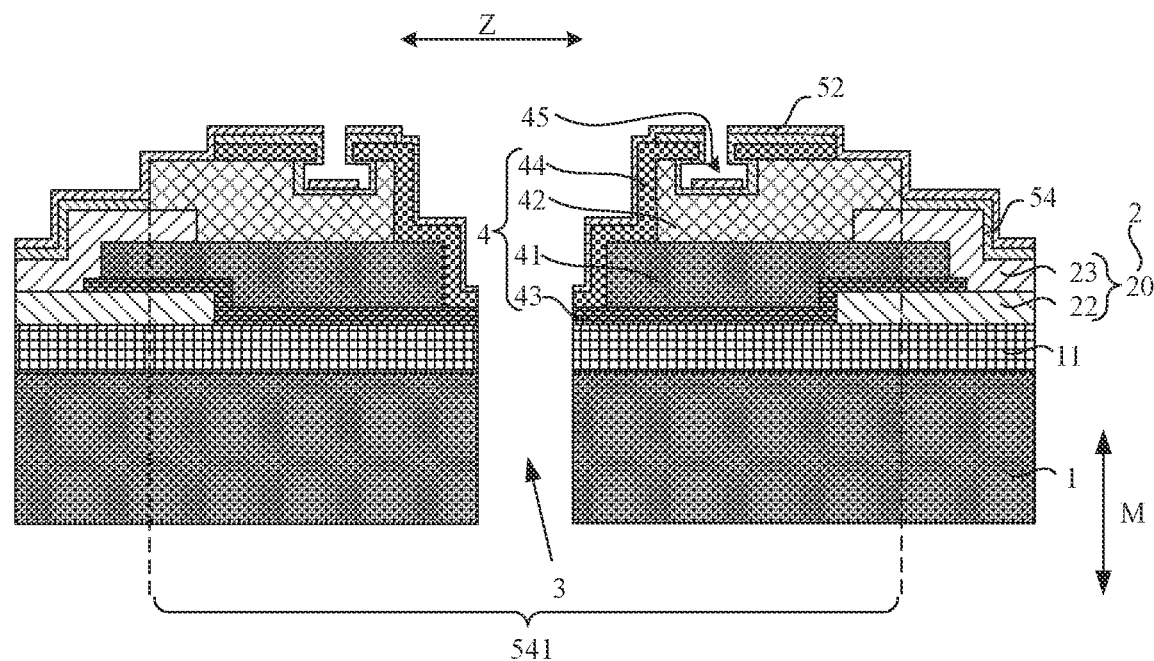
FIG. 4B is a diagram showing a sectional structure of a display substrate in which a cathode layer is partitioned, in accordance with some embodiments.

As shown in FIGS. 4A and 4B, an isolation column 4 covered by the cathode layer 52 (including an isolation column 4 completely covered by the cathode layer 52 or an isolation column 4 partially covered by the cathode layer 52) is provided with a partition groove 45 therein, and an orthographic projection of the partition groove 45 on the flexible substrate 1 is disposed around the hole 3 (for example, for the isolation column 4 completely covered by the cathode layer 52, the orthographic projection of the partition groove 45 therein on the flexible substrate 1 may be disposed around the hole 3 in a circle; for the isolation column 4 partially covered by the cathode layer 52, the orthographic projection of the partition groove 45 therein on the flexible substrate 1 may be disposed around the hole 3 only in a half circle or a one-third circle).

The partition groove 45 is configured to partition both the light-emitting functional layer 51 and the cathode layer 52 (as shown in FIG. 4A); alternatively, the partition groove 45 is configured to partition only the cathode layer 52 (as shown in FIG. 4B).

In this way, after the display substrate is encapsulated, the moisture may be prevented from permeating from a side of the partition groove 45 proximate to the hole 3 to a side of the partition groove 45 away from the hole 3, so as to ameliorate an influence of the moisture on the light-emitting functional layer 51 and the cathode layer 52.

In some examples, referring to FIG. 4A, the display substrate 100 further includes an anode layer, and the anode layer includes a plurality of anodes 53 corresponding to a plurality of sub-pixels. For example, the anode 53 manufactured on the partition groove 45 may be attached to an inner wall of the partition groove 45.

Figure 4C:
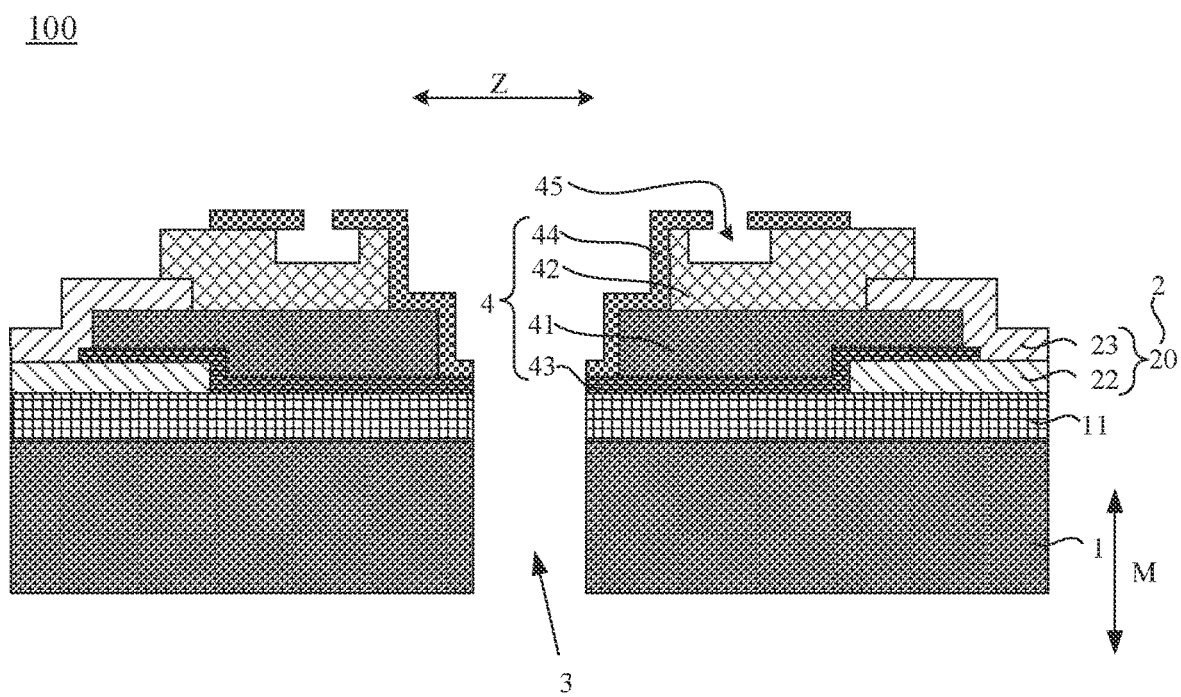
FIG. 4C is a diagram showing a sectional structure of a display substrate having a partition groove, in accordance with some embodiments.

For example, referring to FIGS. 4A to 4C, a section obtained by sectioning the partition groove 45 with a plane parallel to both of a radial direction Z of the hole 3 and a thickness direction M of the display substrate 100 is substantially in a shape of an inverted "T". With this design, it is conducive to partitioning both of the light-emitting functional layer 51 and the cathode layer 52 when manufacturing the light-emitting functional layer 51 and the cathode layer 52, so that the partitioned middle portions may be deposited at a bottom of the partition groove 45. As a result, it is conducive for subsequent encapsulation layer to achieve good encapsulation.

Being substantially in the shape of the inverted "T" may refer to being in the described shape (i.e., the shape of the inverted "T") or being in a shape similar to the described shape such as a shape of an inverted "T" whose border has a curvature or is in a shape of a zigzag.

For example, as shown in FIGS. 4A to 4C, in a case where the isolation column 4 includes the second organic insulating layer 42 and the second inorganic insulating layer 44, the partition groove 45 may pass through the second inorganic insulating layer 44 and at least a portion of the second organic insulating layer 42. It is worth pointing out that, in some examples, by directly etching the second organic insulating layer 42 and the second inorganic insulating layer 44 that are arranged in a stack, the partition groove having the section substantially in the shape of the inverted "T" may be obtained. In this case, it is possible to have advantages of simple process and convenient manufacture.

In some embodiments, referring to FIG. 1, the signal line 2 may be the voltage signal line 20 located in the non-display area $Q_2$, and the voltage signal line 20 may be disposed around the display area $Q_1$.

Figure 5:
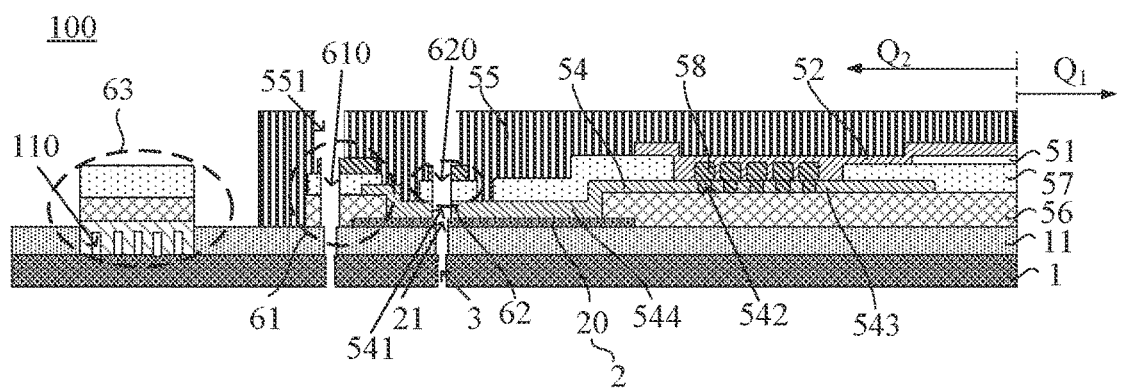
FIG. 5 is a diagram showing a sectional structure of the display substrate in FIG. 1 taken along the line C-C', in accordance with some embodiments.

Referring to FIGS. 4A, 4B and 5, the display substrate 100 further includes a cathode lapping layer 54 located in the non-display area $Q_2$. As shown in FIG. 5, the cathode lapping layer 54 includes a first portion 543 and a second portion 544 connected to each other, the first portion 543 is electrically connected to a surface of the cathode layer 52 proximate to the flexible substrate 1, and the second portion 544 is connected to a surface of the voltage signal line 20 away from the flexible substrate 1.

The cathode lapping layer 54 has at least one second avoidance opening 541, and an orthogonal projection of a border of the second avoidance opening 541 on the flexible substrate 1 is disposed around the hole 3 (for example, the orthogonal projection of the border of the second avoidance opening 541 on the flexible substrate 1 may be disposed around the hole 3 in a circle, or may be disposed around the hole 3 in a half circle or a one-third circle).

With this design, the cathode lapping layer 54 located in the non-display area $Q_2$ may avoid the holes 3. That is, the arrangement of the cathode lapping layer 54 does not affect the arrangement positions of the holes 3 in the non-display area $Q_2$, so that the stretchable region A of the flexible substrate 1 may have basically the same stretchability in the display area $Q_1$ and the non-display area $Q_2$.

For example, referring to FIGS. 4A and 4B, at least a part of the isolation columns 4 covers a sidewall of the second avoidance opening 541. In this way, the isolation column 4 may be used to protect a sidewall of the cathode lapping layer 54 proximate to the hole 3 (i.e., the sidewall of the second avoidance opening 541), thereby preventing the cathode lapping layer 54 from being corroded by moisture and oxygen, and preventing a replacement reaction from undergoing between metal in the cathode lapping layer 54 and metal ions in an etching solution.

For another example, at least a part of the isolation columns 4 covers the sidewall of the second avoidance opening 541 and a portion, proximate to the second avoidance opening 541, of a surface of the cathode lapping layer 54 away from the flexible substrate 1. In this way, the isolation column 4 may be used to better protect the cathode lapping layer 54, thereby preventing the cathode lapping layer 54 from being corroded by moisture and oxygen, and preventing the replacement reaction from undergoing between the metal in the cathode lapping layer 54 and the metal ions in the etching solution.

The cathode lapping layer 54 and the anode 53 may be made in the same layer with the same material. In this way, it is conducive to simplifying the manufacturing process of the display substrate 100.

On the basis of some of the above embodiments, for example, referring to FIG. 5, the display substrate 100 further includes a first blocking dam 61, a second blocking dam 62 and an encapsulation layer 55.

As shown in FIG. 5, the first blocking dam 61 is disposed on the first side of the flexible substrate 1, and the first blocking dam 61 is located in the non-display area $Q_2$ and disposed around the display area $Q_1$. The first blocking dam 61 covers at least a side of the voltage signal line 20 away from the display area $Q_1$ and a side of the cathode lapping layer 54 away from the display area $Q_1$. The first blocking dam 61 has at least one third avoidance opening 610, and an orthogonal projection of a border of a third avoidance opening 610 on the flexible substrate 1 is disposed around the hole 3 (for example, the orthogonal projection of the border of the third avoidance opening 610 on the flexible substrate 1 may be disposed around the hole 3 in a circle, or may be disposed around the hole 3 in a half circle or a one-third circle). The third avoidance opening 610 is configured to not penetrate both of a side of the first blocking dam 61 proximate to the display area $Q_1$ and a side of the first blocking dam 61 away from the display area $Q_1$. In this way, in the process of manufacturing the display substrate 100, the first blocking dam 61 may block a material on a side thereof proximate to the display area from flowing to a side thereof away from the display area, so that the good encapsulation of the display substrate 100 may be achieved.

For example, as shown in FIG. 5, the first blocking dam 61 further covers a portion (i.e., a portion, proximate to the first blocking dam 61, of the entire surface of the voltage signal line 20 away from the flexible substrate 1) of the surface of the voltage signal line 20 away from the flexible substrate 1 and a portion (i.e., a portion, proximate to the first blocking dam 61, of the entire surface of the cathode lapping layer 54 away from the flexible substrate 1) of the surface of the cathode lapping layer 54 away from the flexible substrate 1.

With continued reference to FIG. 5, in some examples, the first blocking dam 61 may be of a three-layer structure. For example, in a direction away from the flexible substrate 1, a first layer thereof and a planarization layer 56 may be made in a same layer with a same material, a second layer thereof and a pixel definition layer 57 may be made in a same layer with a same material, and a third layer thereof and a filling layer 58 may be made in a same layer with a same material.

The planarization layer 56 may include the first organic insulating layer and/or the second organic insulating layer.

The pixel definition layer 57 extends from the display area $Q_1$ to the non-display area $Q_2$, and a border of the pixel definition layer 57 is located in the non-display area $Q_2$. The pixel definition layer 57 has openings used to define a plurality of sub-pixel regions.

In some examples, as shown in FIG. 5, the cathode lapping layer 54 has a plurality of holes 542 arranged in an array, and at least one hole 542 of the plurality of holes 542 penetrates the cathode lapping layer 54. Orthogonal projections of at least a part of holes 542 of the plurality of holes 542 on the flexible substrate 1 are within an orthographic projection of the planarization layer 56 on the flexible substrate 1. In this way, in the process of manufacturing the display substrate 100, it is possible to release gas generated in a film layer (e.g., the planarization layer 56) below the cathode lapping layer 54, thereby improving a reliability of the display substrate.

The filling layer 58 may be used to fill the holes 542 in the cathode lapping layer 54. In this way, an upper surface of the cathode lapping layer 54 may be planarized to facilitate manufacturing of other film layers on the cathode lapping layer 54.

Here, it will be noted that in a case where the cathode layer 52 overlaps with the cathode lapping layer 54, a region where they are actually electrically connected is in a shape of a mesh, and a portion filled with a material of the filling layer in the middle of the mesh is non-conductive.

As shown in FIG. 5, the second blocking dam 62 is disposed on the first side of the flexible substrate 1, and the second blocking dam 62 is located in the non-display area $Q_2$ and disposed around the display area $Q_1$. The second blocking dam 62 is located on a surface of the second portion 544 of the cathode lapping layer 54 away from the flexible substrate 1. The second blocking dam 62 has at least one fourth avoidance opening 620, and an orthogonal projection of a border of a fourth avoidance opening 620 on the flexible substrate 1 is disposed around the hole 3 (for example, the orthogonal projection of the border of the fourth avoidance opening 620 on the flexible substrate 1 may be disposed around the hole 3 in a circle, or may be disposed around the hole 3 in a half circle or a one-third circle).

For example, as shown in FIG. 5, the fourth avoidance opening 620 may expose the second avoidance opening 541, the first avoidance opening 21 and the hole 3 in sequence.

In some examples, the second blocking dam 62 may be of a double-layer structure. For example, in the direction away from the flexible substrate 1, a first layer thereof and the pixel definition layer 57 may be made in a same layer with a same material, and a second layer thereof and the filling layer 58 may be made in a same layer with a same material.

Figure 6:
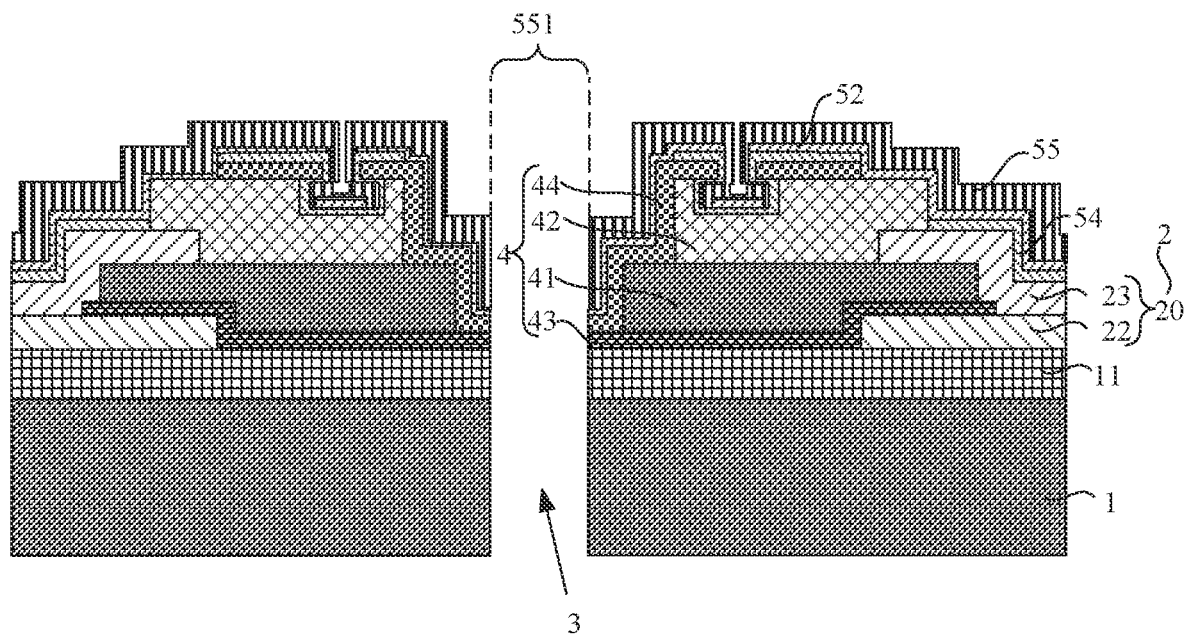
FIG. 6 is a diagram showing another sectional structure of the display substrate in FIG. 1 taken along the line D-D', in accordance with some embodiments.

Referring to FIGS. 5 and 6, the encapsulation layer 55 is disposed on the first side of the flexible substrate 1, and the encapsulation layer 55 covers the cathode layer 52, the first blocking dam 61 and the second blocking dam 62; the encapsulation layer 55 has at least one fifth avoidance opening 551, and an orthogonal projection of a border of the fifth avoidance opening 551 on the flexible substrate 1 is disposed around the hole 3 (for example, the orthogonal projection of the border of the fifth avoidance opening 551 on the flexible substrate 1 may be disposed around the hole 3 in a circle, or may be disposed around the hole 3 in a half circle or a one-third circle).

In some embodiments of the present disclosure, referring to FIGS. 3A, 3B, 4A to 40, 5 and 6, the display substrate 100 may further include a buffer layer 11 located on the first side of the flexible substrate 1. The buffer layer 11 extends from the display area $Q_1$ to the non-display area $Q_2$, and a border of the buffer layer 11 is located on the side of the first blocking dam 61 away from the display area $Q_1$. The buffer layer 11 has openings exposing the holes 3.

On this basis, for example, as shown in FIG. 5, a portion of the buffer layer 11 extending to the side of the first blocking dam 61 away from the display area $Q_1$ has at least one groove 110 formed therein, and the groove 110 is disposed around the first blocking dam 61. In this way, in the process of manufacturing the display substrate 100, the groove 110 may prevent outer cracks from extending inward to affect the display area $Q_1$, thereby improving the reliability of the display substrate 100.

For example, as shown in FIG. 5, a third blocking dam 63 may be provided on a side of the groove 110 away from the flexible substrate 1. It may be possible to achieve a good effect of avoiding the extension of the cracks may be better by the third blocking dam 63.

Figure 7:
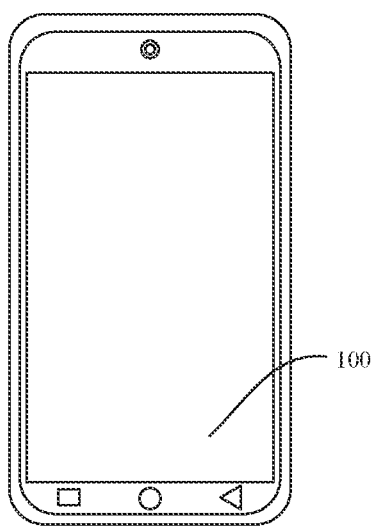
FIG. 7 is a diagram showing a structure of a display apparatus, in accordance with some embodiments.

Some embodiments of the present disclosure provide a display apparatus 200, as shown in FIG. 7, the display apparatus 200 includes the display substrate 100 as described in any one of the above embodiments.

For example, the display apparatus 200 may be, for example, any product or component having a display function, such as a mobile phone, a tablet computer, a television, a monitor, a notebook computer, a digital photo frame or a navigator.

As for technical effects of the display device 200, reference may be made to technical effects of the display substrate as described in any one of the above embodiments, and details will not be repeated here.

Figure 8:
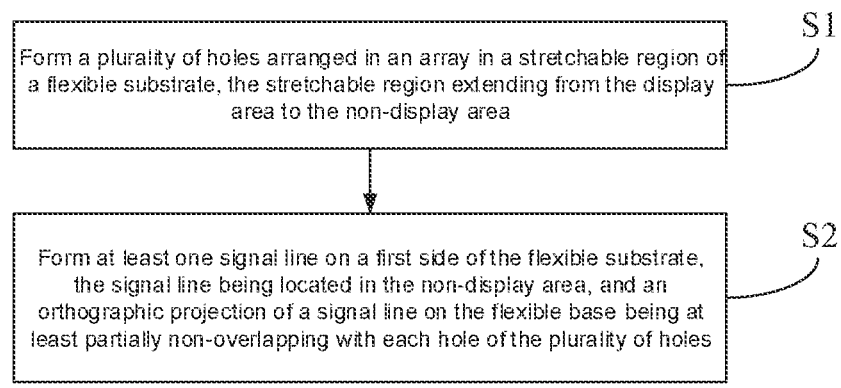
FIG. 8 is a flow diagram of a manufacturing method for a display substrate, in accordance with some embodiments.
Figure 9:
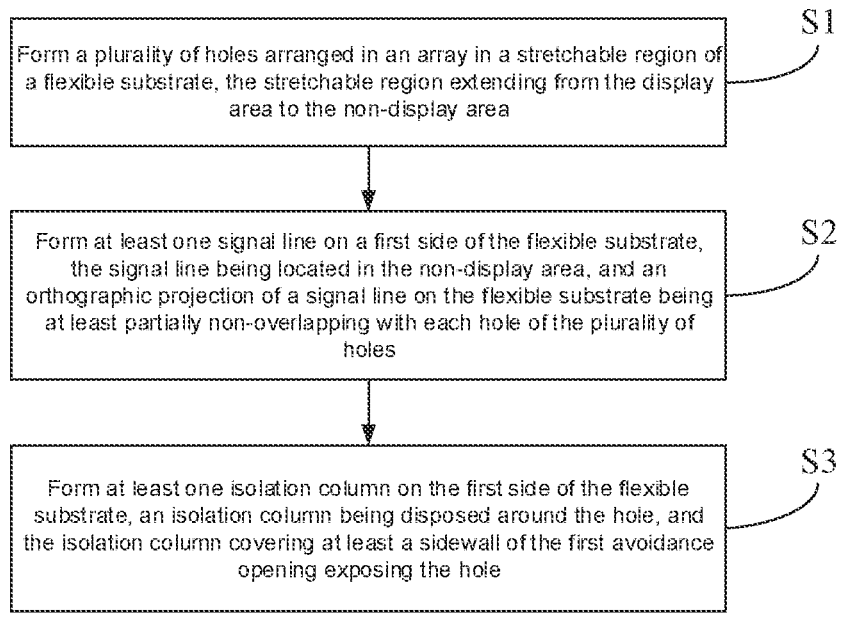
FIG. 9 is a flow diagram of another manufacturing method for a display substrate, in accordance with some embodiments.

Some embodiments of the present disclosure provide a manufacturing method of a display substrate, referring to FIGS. 1 and 2, the display substrate 100 has a display area $Q_1$ and a non-display area $Q_2$ adjacent to the display area $Q_1$. Referring to FIG. 8, the manufacturing method includes S1 and S2.

In S1, a plurality of holes 3 arranged in an array are formed in a stretchable region A of a flexible substrate 1, and the stretchable region A extends from the display area $Q_1$ to the non-display area $Q_2$.

In S2, at least one signal line 2 is formed on a first side of the flexible substrate 1, the signal line 2 is located in the non-display area $Q_2$, and an orthographic projection of a signal line 2 on the flexible substrate 1 is at least partially non-overlapping with each hole 3 of the plurality of holes 3.

For example, as shown in FIG. 2, the signal line 2 has at least one first avoidance opening 21, and an orthogonal projection of a border of a first avoidance opening 21 on the flexible substrate 1 is disposed around a holes 3 (for example, in the example as shown in FIG. 2, the orthographic projection of the border of the first avoidance opening 21 on the flexible substrate 1 may be disposed around the hole 3 in a circle, or may be disposed around the hole 3 in a half circle or a one-third circle). On this basis, referring to FIGS. 3A, 3B and 9, the manufacturing method further includes S3.

In S3, at least one isolation column 4 is formed on the first side of the flexible substrate 1, an orthographic projection of a border of an isolation column 4 on the flexible substrate 1 is disposed around the hole 3, and the isolation column 4 covers at least a sidewall of the first avoidance opening 21 exposing the hole 3.

Figure 10:
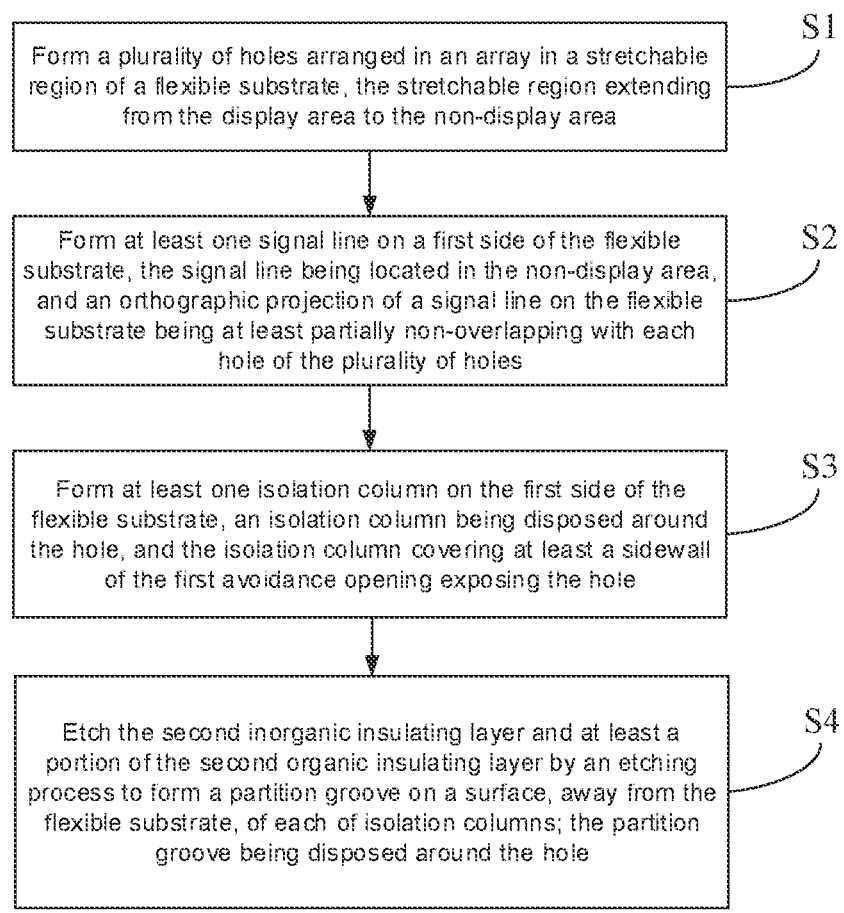
FIG. 10 is a flow diagram of yet another manufacturing method for a display substrate, in accordance with some embodiments.

For example, referring to FIGS. 4A and 4B, the isolation column 4 includes a second organic insulating layer 42 and a second inorganic insulating layer 44 that are sequentially away from the flexible substrate 1. Referring to FIG. 10, the manufacturing method may further include S4.

In S4, the second inorganic insulating layer 44 and at least a portion of the second organic insulating layer 42 are etched by an etching process to form a partition groove 45 on a surface, away from the flexible substrate 1, of each of at least part of the isolation columns 4; the partition groove 45 is disposed around the hole 3. A material of the isolation column 4 and the shape of the partition groove 45 are described in detail above, and will not be repeated here.

The manufacturing method of the display substrate provided by some embodiments of the present disclosure is used to manufacture the display substrate 100 as described in any one of the above embodiments. Therefore, the manufactured display substrate 100 has all of the beneficial effects described above, and details will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area and a non-display area adjacent to the display area; the display substrate comprising:
    a flexible substrate including at least one stretchable region, the at least one stretchable region extending from the display area to the non-display area, and being provided with a plurality of holes arranged in an array therein;
    at least one signal line disposed on a first side of the flexible substrate and located in the non-display area, wherein an orthographic projection of a signal line of the at least one signal line on the flexible substrate is at least partially non-overlapping with each hole of the plurality of holes, the signal line has at least one first avoidance opening, and an orthogonal projection of a border of a first avoidance opening of the at least one first avoidance opening on the flexible substrate is disposed around a hole; and
    at least one isolation column disposed on the first side of the flexible substrate, wherein an orthographic projection of a border of an isolation column of the at least one isolation column on the flexible substrate is disposed around the hole, and the isolation column covers at least a sidewall of the first avoidance opening exposing the hole.

2. The display substrate according to claim 1, wherein the orthographic projection of the signal line on the flexible substrate is non-overlapping with each hole of the plurality of holes exactly.

3. The display substrate according to claim 1, wherein
    the isolation column further covers a portion, proximate to the first avoidance opening, of a surface of the signal line away from the flexible substrate.

4. The display substrate according to claim 1, wherein the signal line includes a first metal layer and a second metal layer that are sequentially away from the flexible substrate; the isolation column includes a first organic insulating layer and a second organic insulating layer that are sequentially away from the flexible substrate;
    the first organic insulating layer covers a side of the first metal layer proximate to the hole and a portion of a surface of the first metal layer away from the flexible substrate;
    the second metal layer is in electrical contact with the first metal layer, and the second metal layer covers a side of the first organic insulating layer away from the hole and a portion of a surface of the first organic insulating layer away from the flexible substrate; and
    the second organic insulating layer covers a side of the second metal layer proximate to the hole and a portion of a surface of the second metal layer away from the flexible substrate.

5. The display substrate according to claim 4, wherein the isolation column further includes:
   a first inorganic insulating layer; wherein a portion of the first inorganic insulating layer is located between the first organic insulating layer and the flexible substrate, another portion of the first inorganic insulating layer is located between the first metal layer and the second metal layer, and yet another portion of the first inorganic insulating layer is located between the first metal layer and the first organic insulating layer; and
   a second inorganic insulating layer; wherein the second inorganic insulating layer covers at least a portion of a surface of the second organic insulating layer away from the flexible substrate, a side of the second organic insulating layer proximate to the hole and a side of the first organic insulating layer proximate to the hole, and the second inorganic insulating layer is in contact with to the first inorganic insulating layer.

6. The display substrate according to claim 1, further comprising a light-emitting functional layer and a cathode layer that are sequentially disposed on the first side of the flexible substrate; wherein
   the cathode layer extends from the display area to the non-display area, and a border of the cathode layer is located in the non-display area; and
   the light-emitting functional layer extends from the display area to the non-display area, and an orthographic projection of the light-emitting functional layer on the flexible substrate is located within an orthographic projection of the cathode layer on the flexible substrate;
   wherein an isolation column covered by the cathode layer is provided with a partition groove therein, the partition groove is disposed around the hole, and the partition groove is configured to partition the cathode layer or partition both the cathode layer and the light-emitting functional layer.

7. The display substrate according to claim 6, wherein the isolation column includes a second organic insulating layer and a second inorganic insulating layer, the second organic insulating layer and the second inorganic insulating layer are arranged in a stack, and the partition groove passes through the second inorganic insulating layer and at least a portion of the second organic insulating layer.

8. The display substrate according to claim 6, wherein a section obtained by sectioning the partition groove with a plane parallel to both of a radial direction of the hole and a thickness direction of the display substrate is substantially in a shape of an inverted "T".

9. The display substrate according to claim 6, wherein the signal line is a voltage signal line, and the voltage signal line is disposed around the display area;
   the display substrate further comprises:
   a cathode lapping layer located in the non-display area and including a first portion and a second portion connected to each other, the first portion being electrically connected to a surface of the cathode layer proximate to the flexible substrate, and the second portion being connected to a surface of the voltage signal line away from the flexible substrate; wherein
   the cathode lapping layer has at least one second avoidance opening, and an orthogonal projection of a border of a second avoidance opening of the at least one second avoidance opening on the flexible substrate is disposed around the hole.

10. The display substrate according to claim 9, wherein at least a portion of the isolation column covers a sidewall of the second avoidance opening; or
   at least a portion of the isolation column covers the sidewall of the second avoidance opening and a portion, proximate to the second avoidance opening, of a surface of the cathode lapping layer away from the flexible substrate.

11. The display substrate according to claim 9, further comprising:
   a first blocking dam disposed on the first side of the flexible substrate; the first blocking dam being located in the non-display area and disposed around the display area; wherein the first blocking dam covers at least a side of the voltage signal line away from the display area and a side of the cathode lapping layer away from the display area; and the first blocking dam has at least one third avoidance opening, and an orthogonal projection of a border of a third avoidance opening of the at least one third avoidance opening on the flexible substrate is disposed around the hole;
   a second blocking dam disposed on the first side of the flexible substrate; the second blocking dam being located in the non-display area and disposed around the display area; wherein the second blocking dam is located on a surface of the second portion of the cathode lapping layer away from the flexible substrate; and the second blocking dam has at least one fourth avoidance opening, and an orthogonal projection of a border of a fourth avoidance opening of the at least one fourth avoidance opening on the flexible substrate is disposed around the hole; and
   an encapsulation layer disposed on the first side of the flexible substrate; wherein the encapsulation layer covers the cathode layer, the first blocking dam and the second blocking dam; and the encapsulation layer has at least one fifth avoidance opening, and an orthogonal projection of a border of a fifth avoidance opening of the at least one fifth avoidance opening on the flexible substrate is disposed around the hole.

12. The display substrate according to claim 11, further comprising:
   a buffer layer located on the first side of the flexible substrate, the buffer layer extending from the display area to the non-display area, and a border of the buffer layer being located on a side of the first blocking dam away from the display area; wherein
   a portion of the buffer layer extending to the side of the first blocking dam away from the display area is provided with at least one groove therein, and the at least one groove is disposed around the first blocking dam.

13. The display substrate according to claim 12, further comprising:
   a third blocking dam covering the at least one groove in the buffer layer.

14. The display substrate according to claim 1, wherein the plurality of holes arranged in the array include:
   first holes each extending in a first direction; and
   second holes each extending in a second direction intersecting the first direction;
   wherein the first holes and the second holes are alternately arranged in both of the first direction and the second direction.

15. A display apparatus, comprising:
   the display substrate according to claim 1.

16. A manufacturing method for a display substrate, the display substrate having a display area and a non-display area adjacent to the display area; the manufacturing method comprising:

forming a plurality of holes arranged in an array in a stretchable region of a flexible substrate, the stretchable region extending from the display area to the non-display area;

forming at least one signal line on a first side of the flexible substrate; the at least one signal line being located in the non-display area, and an orthographic projection of a signal line of the at least one signal line on the flexible substrate being at least partially non-overlapping with each hole of the plurality of holes, wherein the signal line has at least one first avoidance opening, and an orthogonal projection of a border of a first avoidance opening of the at least one first avoidance opening on the flexible substrate is disposed around the hole; and forming at least one isolation column on the first side of the flexible substrate, wherein an orthographic projection of a border of an isolation column of the at least one isolation column on the flexible substrate is disposed around the hole, and the isolation column covers at least a sidewall of the first avoidance opening exposing the hole.

17. The manufacturing method according to claim 16, wherein the at least one isolation column includes isolation columns, and each isolation column includes a second organic insulating layer and a second inorganic insulating layer that are sequentially away from the flexible substrate; the manufacturing method further comprises:

etching the second inorganic insulating layer and at least a portion of the second organic insulating layer by an etching process to form a partition groove on a surface, away from the flexible substrate, of each of at least part of the isolation columns; wherein the partition groove is disposed around the hole.

* * * * *